(12) United States Patent
Wickman et al.

(10) Patent No.: US 7,075,958 B2
(45) Date of Patent: Jul. 11, 2006

(54) METHOD OF MONITORING AN OPTICAL SIGNAL FROM A LASER

(75) Inventors: Randy W. Wickman, Cadott, WI (US); Gary T. O'Connor, Bolingbrook, IL (US)

(73) Assignee: Corona Optical Systems, Inc., Lombard, IL (US)

( * ) Notice: Subject to any disclaimer, the term of this patent is extended or adjusted under 35 U.S.C. 154(b) by 217 days.

(21) Appl. No.: 10/859,833

(22) Filed: Jun. 2, 2004

(65) Prior Publication Data

US 2004/0218643 A1 Nov. 4, 2004

Related U.S. Application Data

(63) Continuation of application No. 10/144,519, filed on May 13, 2002, now abandoned.

(51) Int. Cl.
*H01S 3/00* (2006.01)
(52) U.S. Cl. .................. 372/33; 372/29.02; 372/107
(58) Field of Classification Search ............ 372/33, 372/29.02, 29.011, 107, 43.01
See application file for complete search history.

(56) References Cited

U.S. PATENT DOCUMENTS 6,850,657 B1 * 2/2005 Dhadwal et al. ............. 385/12
6,970,494 B1 * 11/2005 Bendett et al. ............. 372/102

* cited by examiner

*Primary Examiner*—Harvey Minsun
*Assistant Examiner*—Tuan N. Nguyen
(74) *Attorney, Agent, or Firm*—Welsh & Katz, Ltd.

(57) ABSTRACT

A method and apparatus are provided for monitoring an optical signal from a solid state laser. The method includes the steps of providing a planar substrate defined by opposing planar surfaces and a substrate edge that together define a substrate volume that is transparent to an optical signal from the solid state laser, disposing the solid state laser on one of the opposing planar surfaces the planar substrate such that a first portion of the optical signal travels directly through the planar substrate substantially orthogonal to the opposing planar surfaces and a second portion of the optical signal is reflected between the opposing planar surfaces of the planar substrate and passes out of the substrate through the substrate edge, and disposing an optical detector proximate the edge of the planar substrate to detect the second portion of the optical signal.

14 Claims, 5 Drawing Sheets

METHOD OF MONITORING AN OPTICAL SIGNAL FROM A LASER

CROSS REFERENCE TO RELATED APPLICATIONS

This application claims the benefits of U.S. Provisional Application No. 60/291,678 filed May 17, 2001.

FIELD OF THE INVENTION

The field of the invention relates to solid state lasers and more particularly to monitoring an output of a solid state laser.

BACKGROUND OF THE INVENTION

Solid state lasers are generally known. Such devices are typically constructed by coupling a light-emitting diode to a resonant cavity.

A vertical cavity surface emitting laser (VCSEL) is one type of solid state laser. For example, 850 nm VCSELs may be built in the AlGaAs/GaAs material system and fabricated on a GaAs substrate. Like most semiconductor lasers, the active region of the VCSEL consists of multiple quantum wells, but, unlike edge-emitting lasers, the mirrors are formed during epitaxial growth using distributed Bragg reflectors (DBRs). The GaAs substrate functions to absorb photonic energies greater than the GaAs bandgap.

Most VCSEL devices are designed to emit light out of only one of the distributed Bragg reflector (DBR) facets. As such, associated transmission structures may be coupled directly to those facets.

While VCSEL lasers work well, they are still subject to failure and degradation due to time and temperature. Because of the importance of optical communications, a need exists for a means of monitoring VCSEL devices that is not subject to its own inherent defects.

VCSELs need some form of power control to maintain a constant output. Such power control could be performed automatically by measuring an output of a light emitting device during operation and using this measurement to control the power supplied to the light emitting device. Such control may be easily achieved when the light emitting device is an edge emitting laser because edge emitting lasers output light from two ends thereof. Thus, one output may be used for the desired application, while the other output may be used for the power control.

Previous attempts to monitor the power of VCSELS typically involve splitting off a portion of the output beam to use as a monitor beam. However, such splitting off obscures part of the beam which may affect the wavefront and imaging, and hence coupling, of the light. Further, if the intensity distribution changes, such as when there is a change in lasing mode, the monitored power may change in a way which does not represent the overall output power of the VCSEL within a desired lasing mode.

Additionally, splitting off a portion of the beam may require that the output of the VCSEL to be increased in order to maintain the requisite power level at a laser receiver while allowing the monitoring function. Previous methods of scattering the beam to create a monitor beam relied on reflection for directing the beam and did not provide an optimal signal to the monitor detector. Further, previous scattering did not insure the entire beam was being monitored. Beam splitting may also require complex optical reflecting components that can be costly and involve precise alignment steps.

In this invention is disclosed a novel method for monitoring the output performance of a VCSEL array of optical ports. The invention uses light from the VCSEL that is divergent from the optical signal entering the optical waveguide. In other words, light not entering the waveguide because of natural optical losses is thus utilized for the purpose of monitoring the VCSEL. By using light that would otherwise be scattered or absorbed (lost light), more light is transmitted down an optical fiber, and signal integrity may be preserved.

SUMMARY OF THE INVENTION

A method and apparatus are provided for monitoring an optical signal from a solid state laser. The method includes the steps of providing a planar substrate defined by opposing planar surfaces and a substrate edge that together define a substrate volume that is transparent to an optical signal from the solid state laser, disposing the solid state laser on one of the opposing planar surfaces of the planar substrate such that a first portion of the optical signal travels directly through the planar substrate substantially orthogonal to the opposing planar surfaces and a second portion of the optical signal is reflected between the opposing planar surfaces of the planar substrate and passes out of the substrate through the substrate edge, and disposing an optical detector proximate the edge of the planar substrate to detect the second portion of the optical signal.

BRIEF DESCRIPTION OF FIGURES

FIG. 4b depicts a detailed view of the substrate and laser array of FIG. 4a;

FIG. 5b depicts a detailed view of the substrate and laser array of FIG. 5a.

DETAILED DESCRIPTION OF A PREFERRED EMBODIMENT

Figure 1:
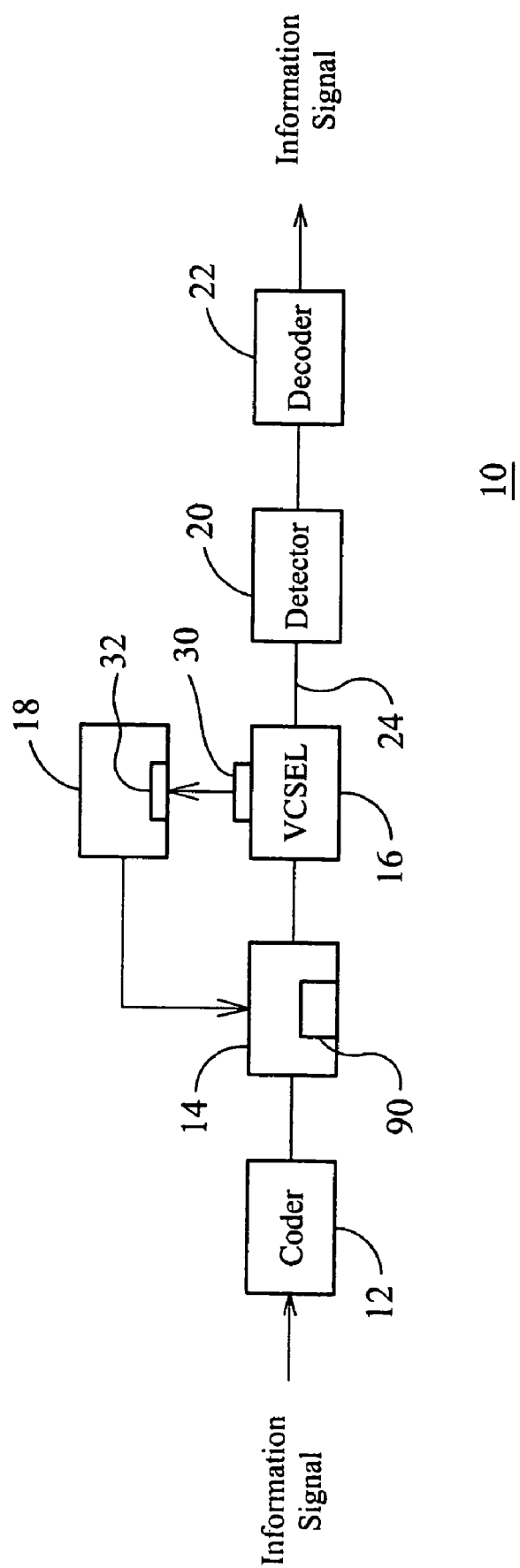
FIG. 1 depicts an optical communication system in accordance with an illustrated embodiment of the invention.

FIG. 1 depicts a simplified laser communication system 10, shown generally under an illustrated embodiment of the invention. Under the illustrated embodiment, an information signal is coded under an appropriate format within an encoder 12. An output of the coder 12 may be provided as a control signal to a laser driver 14 that may, in turn, provide a driving signal to a solid state laser 16. The laser 16 may convert the electrical driving signal into an optical signal that may then be transmitted through a waveguide 24 to a remote location.

At the remote location, a detector 20 may convert the optical signal back into the electrical domain. A decoder 22 may retrieve the information signal for use locally.

In order to maintain transmission efficiency across the waveguide 24, a feedback and monitoring circuit 18 may be provided to monitor the output of the laser 16. As an output of the laser 16 changes, a photonics detector 30 may detect the optical signal and a monitoring circuit 18 may adjust a gain of the driving circuit 14 as appropriate to maintain a constant transmission signal.

Figure 2:
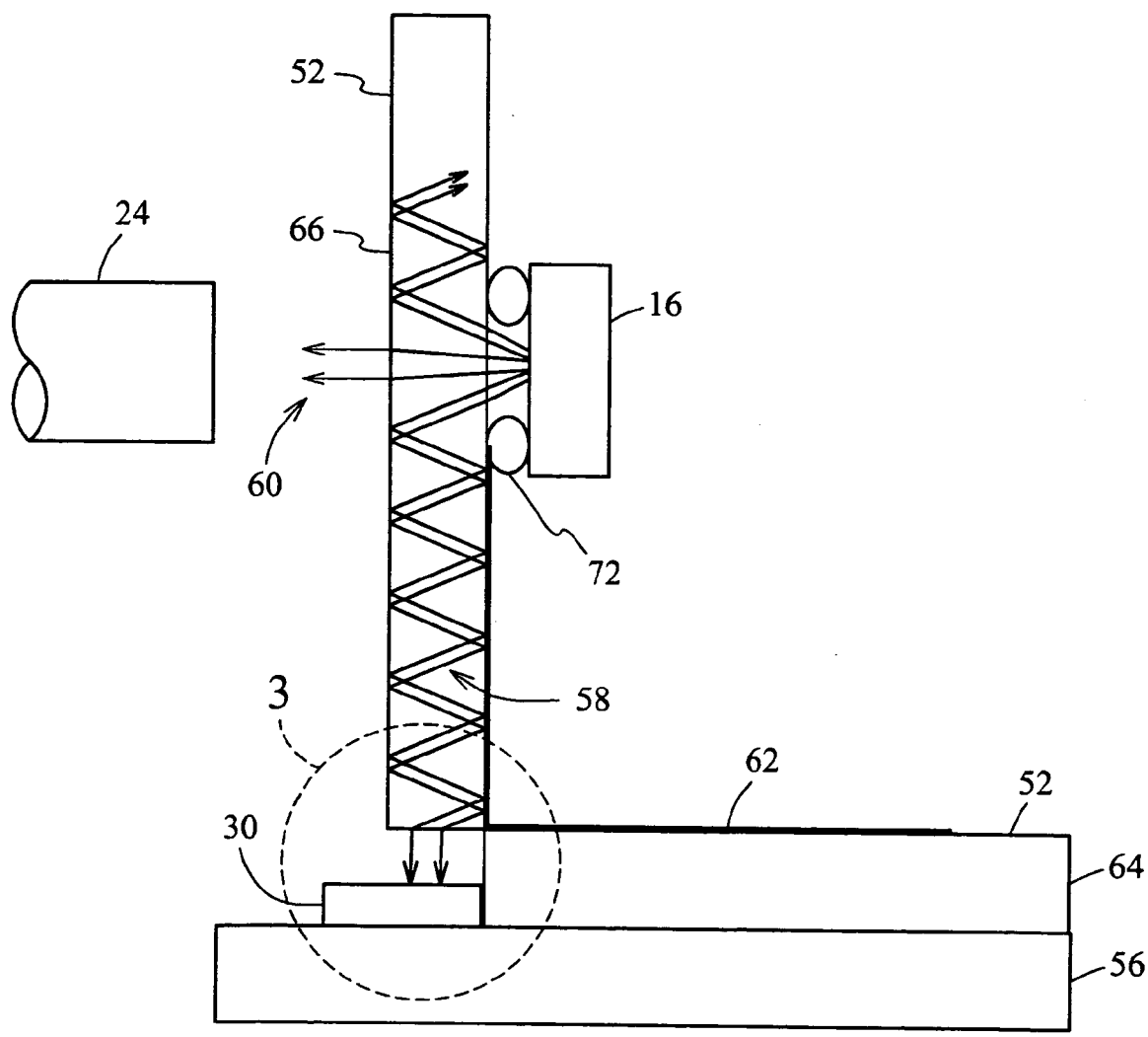
FIG. 2 depicts a side view of the laser transmitter system that may be used with the system of FIG. 1.

Shown in FIG. 2 is the laser transmitter system 16, 30 of FIG. 1. Included in the system may be the laser array 16, an optically transparent substrate 52 to which the laser 16 is attached, a printed circuit board 56, and a photonics detector 30 (e.g., a PIN photodiode). The laser array 16 may be mechanically attached to the substrate with an appropriate adhesive (not shown). The laser array 16 may be electrically attached to the signal driver 14 (shown in FIG. 1) by conventional electrical traces 62 and stud bumps 72. The stud bumps 72 may also function to structurally support the laser array 16 to the substrate 52. The traces 62 may traverse both portions of the substrate 52 as shown, electrically attaching the laser array 16 to the signal driver (shown in FIG. 1). The array 16 could also be mechanically and electrically attached by solder balls rather than stud bumps.

The printed circuit board, or PCB, 56 may be any suitable material such as FR4, ceramic interconnect, or the like. The PCB 56 may have a plurality of electrical and optical devices for signal processing, as well as electrical traces and electrical pads (not shown on the PCB 56 in the figure).

The optically transparent substrate 52 may be attached to the PCB 56 by any conventional method (i.e., solder, adhesive, etc.). The substrate 52 may comprise a glass or glass like structure having suitable optical and structural properties, (other materials that have been found to display suitable properties include plastic and ruby crystal). The substrate 52 shown in FIG. 2 contains two planar sections 64, 66 that may be separated by a ninety degree angle (details of the substrate 52 will be discussed in further detail below).

It will be understood that the laser array 16 can be any suitable photonic device or array of photonic devices. Yet, in a preferred embodiment of the present invention, the laser array is a vertical cavity surface emitting laser (VCSEL) array. The laser array 16 may have a number of optical ports 50 (FIG. 6) for coupling light to a respective optical device, such as a waveguide 24. The number of optical ports 50 in the laser array 16 is not limited in any way. The array 16 could have 1 or n optical ports 50. The optical ports 50 may provide transmission paths 60 that pass directly through the substrate 52 to which the laser array 16 is attached, as shown in the FIG. 2.

Also shown in FIG. 2 is an optical detector 30 that may be electrically and mechanically attached to the PCB 56. The detector 30 is positioned to receive a portion of light energy from the laser array 16 as shown. Within the detector 30, the light energy may be detected and converted into an analog feedback signal. The analog signal, in turn, may be coupled to an inverting amplifier 32 (FIG. 1). The monitoring circuit 18 may in turn use the signal from the inverting amplifier 32 to adjust the gain on the laser driver 14 as appropriate.

During operation of the laser communications system 10, the feedback signal may be used to maintain a laser output appropriate to provide an adequate level of energy impinging upon the detector 20. As the laser 16 ages, the level of the feedback signal may fall. As the level of the feedback signal falls, the inverting amplifier 32 may increase a gain of the driver 14 thereby compensating for loss of laser energy.

Figure 4A:
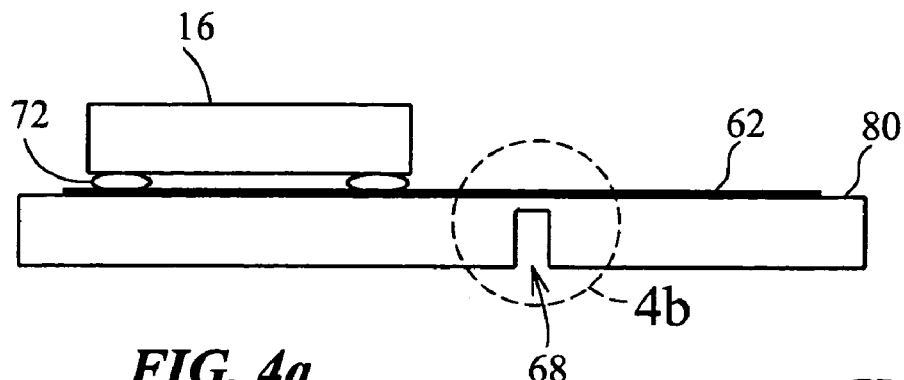
FIG. 4a depicts a side view of the substrate and laser array.

The physical structure of the laser transmitter system 16, 30 will now be discussed in further detail below. As previously stated, the optically transparent substrate 52 may comprise a glass or glass like structure displaying adequate optical and structural properties. Turning to FIG. 4a, the substrate 52 may first be fabricated in a planar form. The optical array 16, and electrical contacts 62 and 72, may all be disposed on a first surface 80 of the substrate 52.

Figure 4B:
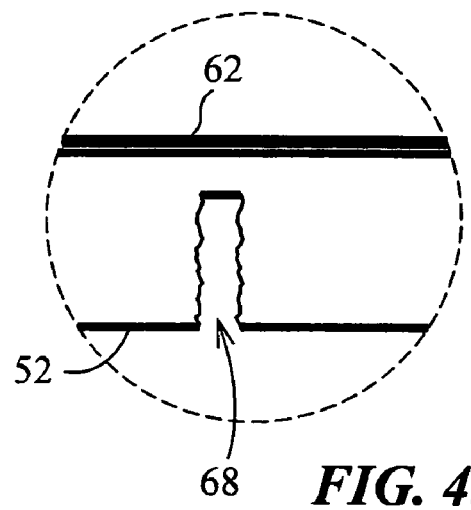
Figure 5A:
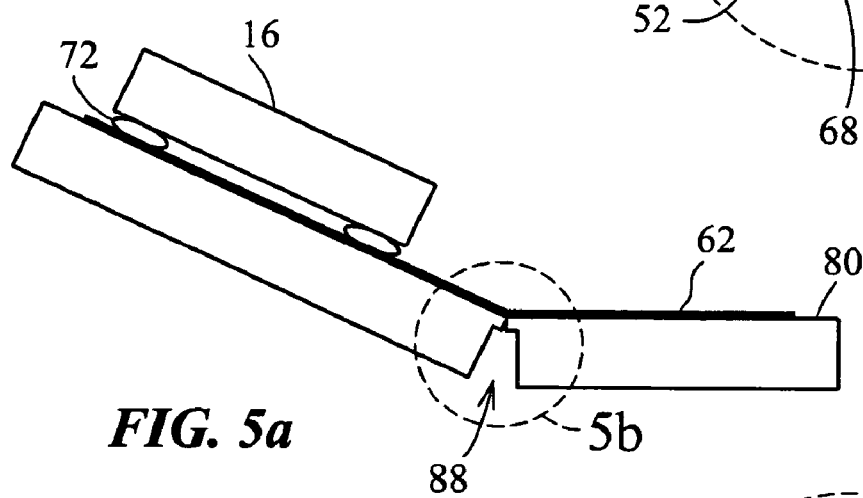
FIG. 5a depicts another side view of substrate and laser array.

FIG. 2 illustrates the substrate 52 having a ninety degree bend to allow optical signals to travel substantially parallel to the PCB 56. As illustrated in FIGS. 4 and 5, the ninety degree bend in the substrate 52 may be formed by breaking the substrate along a groove 68 and rotating a portion of the substrate 52 about the groove 68. After breaking, the substrate 52 may then become a two-member assembly, having relatively rigid planar elements 64 and 66. The groove 68, shown in the enlarged side view of FIG. 4b, may be formed on a second surface 82 of the substrate 52. The groove 68 may be formed at any location on the second surface 82.

The groove 68 could be formed using a conventional laser ablation, laser scribing, or mechanical scribing process. The groove 68 may traverse the width while not extending through the thickness of the substrate 52, as illustrated in FIG. 4b (i.e., about 80% through the thickness). If the groove 68 is formed completely through the thickness of the substrate, the electrical traces 62 could be damaged or separated. The preferred method of forming a groove 68 in the substrate is the conventional laser ablation technique.

Figure 5B:
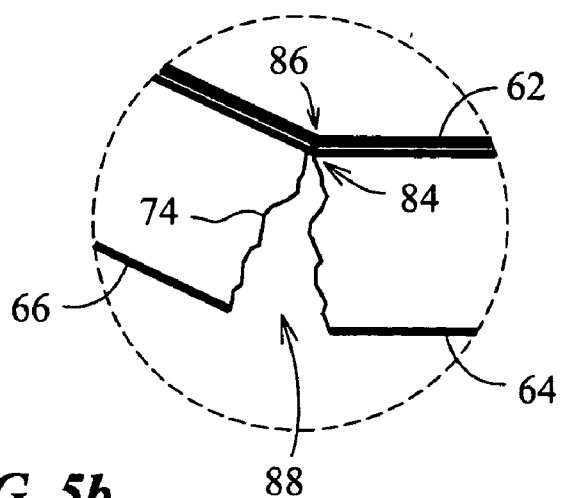

Upon forming the groove 68 partially through the substrate 52, the substrate 52 could be placed in a mechanical fixture that breaks the substrate 52 by rotating the planar elements 64, 66 about the groove 68. The broken substrate 52 with first and second planar elements 64 and 66 may then have an abutting common edge 84, as shown in FIG. 5b. The first and second planar elements 64, 66 may be rotated to any angle, with respect to each other, about the common edge 84 (e.g., the planar elements may form a desired angle of ninety degrees on one side and 270 degrees on the other side).

The conductive traces 62 traversing the substrate 52 (i.e., connecting the two halves 64, 66 of the substrate 52) may structurally and electrically interconnect the two planar elements 64, 66. The conductive traces 62 traversing the two planar elements may also form a hinge 86 extending the width of the substrate 52 (the hinge 86 being located along the common edge 84). The vertical planar element 66 may be rotated along the hinge 86 to any desired angle. In a preferred embodiment of the present invention, the vertical planar element 66 is broken and rotated ninety degrees, forming a ninety-degree angle with the substrate's horizontal planar element 64 as part of a single manufacturing step. Rotating of the substrate to the desired angle in a single step could more quickly and efficiently complete the assembly process of the substrate 52 and two subsections 64, 66. That is, the planar substrate 52 could be broken and rotated to the desired angle by necessarily rotating the second planar element 66 of the substrate 52 about the hinge 86, thus eliminating the separate specific manufacturing process of breaking the substrate 52. Rotating the vertical planar element 66 of the substrate 52 to the desired angle allows the transmission axis 60 of the optical array 16 to be aligned parallel to the PCB 56 and the horizontal planar element 64 of the substrate 52, further promoting planarity and manufacturability.

The vertical planar element 66 may further be held in place by a conventional adhesive and/or polyimide (not shown) applied to the first surface 80 of the substrate 52 near the hinge 86 and common edge 84. In addition, a retaining structure (not shown) could be placed near the second surface 82 of the vertical planar element 66 such that the structure substantially prevents the element 66 from rotating about the hinge 86 from the desired angle. If the angle of the vertical planar element 66 deviates from its nominal position (i.e., the desired angle) with respect to the horizontal planar element 64, optical signals may not be properly aligned to the optical waveguide 24.

As light from the optical array 16 is transmitted through the vertical planar element 66, the majority of the light then passes through the substrate 66 and into an appropriate optical waveguide 24. Yet, a portion of the light 58 is not able to escape the substrate 66. That is, some light enters the substrate 66 and is internally reflected. This portion of the light 58 has the critical angle necessary to be reflected within the substrate 66. The internally reflected light 58 may traverse through the length of the vertical planar element 66 and may in turn be used as a feedback signal to monitoring circuit 18, as further described.

Figure 3:
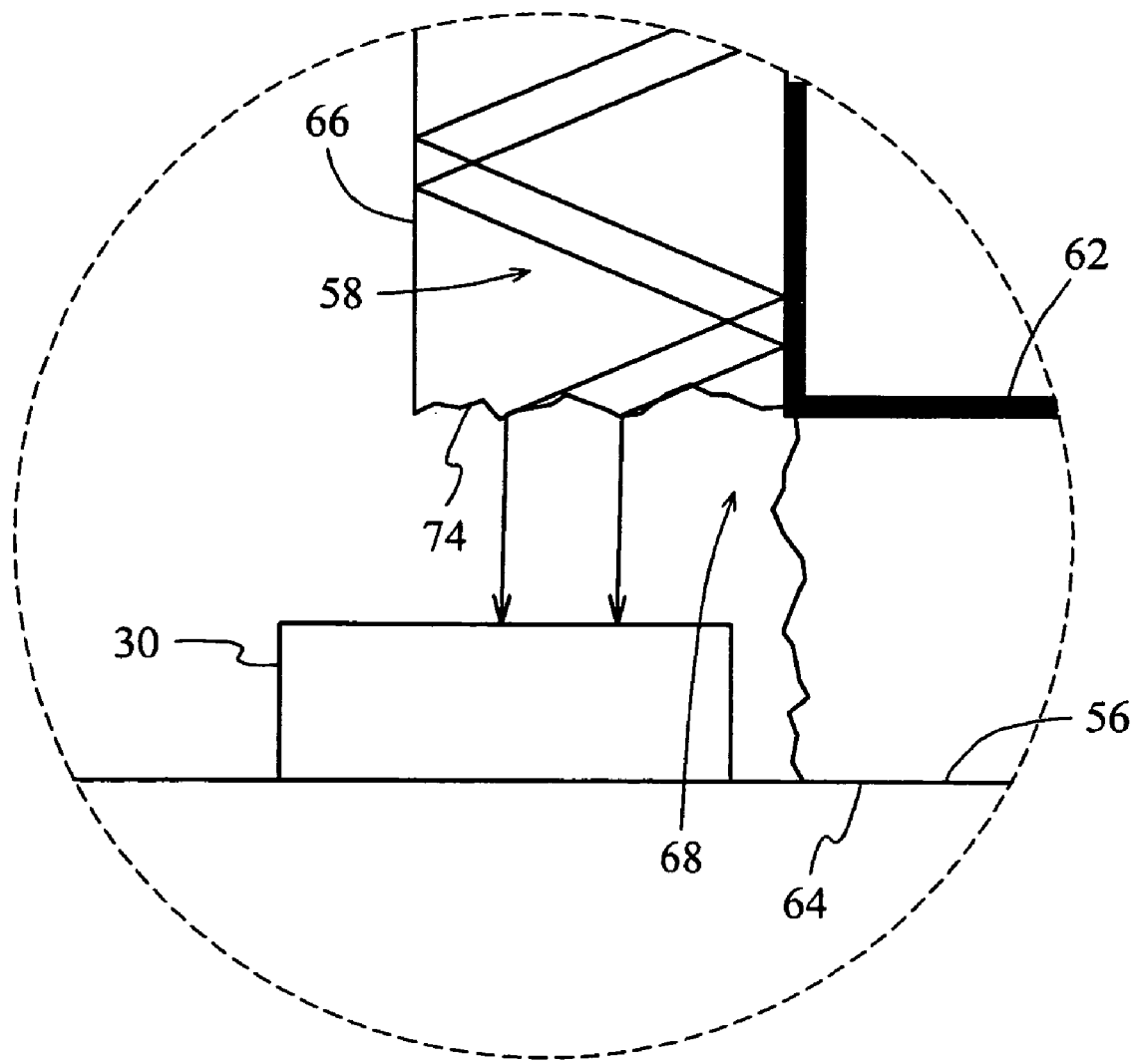
FIG. 3 depicts a detailed view of a portion of the laser transmitter system in FIG. 2.

As shown in FIGS. 3–5, the processes of forming the groove 68 in the substrate 52 and breaking the substrate 52 causes microscopic irregularities to form in the break region 88 planar elements 64, 66. The irregular surfaces of the planar elements 64, 66 shown in further detail in FIGS. 3, 4b and 5b, together make up a break region 88. The irregular surfaces in the break region 88 are similar in structure and function to a roughened or unpolished end of an optical fiber. When light is transmitted down an optical fiber and strikes an unpolished end on a transparent substrate, the light is scattered. A portion of the light is reflected back down the fiber, and a portion of the light is absorbed at the fiber end. Yet, some light exits the fiber through the roughened surface. This light may exit the fiber at a different angle than which it struck the unpolished surface.

The irregularities in the substrate 52 are then similar in structure to a roughened optical fiber. A portion of the light 58 striking a broken edge 74 of the vertical planar element 66 may be allowed to escape the substrate 66 and impinge on the detector 30. This light 58 in turn may be used as the feedback monitoring signal coupled to the monitoring circuit 18.

Shown in greater detail in FIG. 3 is light 58 exiting the vertical planar element 66 through the break edge 74. The feedback photonics detector 30 may be disposed on the PCB 56 such that it receives light 58 exiting the broken edge 74 of the substrate 66. The feedback photonics detector 30 can be situated at or near the broken edge 74 of the vertical planar element 66 to collect light from the optical array 16.

The detector 30 can be any conventional/suitable photodiode or photonics detector. The detector 30 could also be attached to the optically transparent substrate 52, and is not limited to a specific location. The preferred method of use attaches the detector 30 to the PCB 56 near the break region 88 of the substrate 52.

Figure 6:
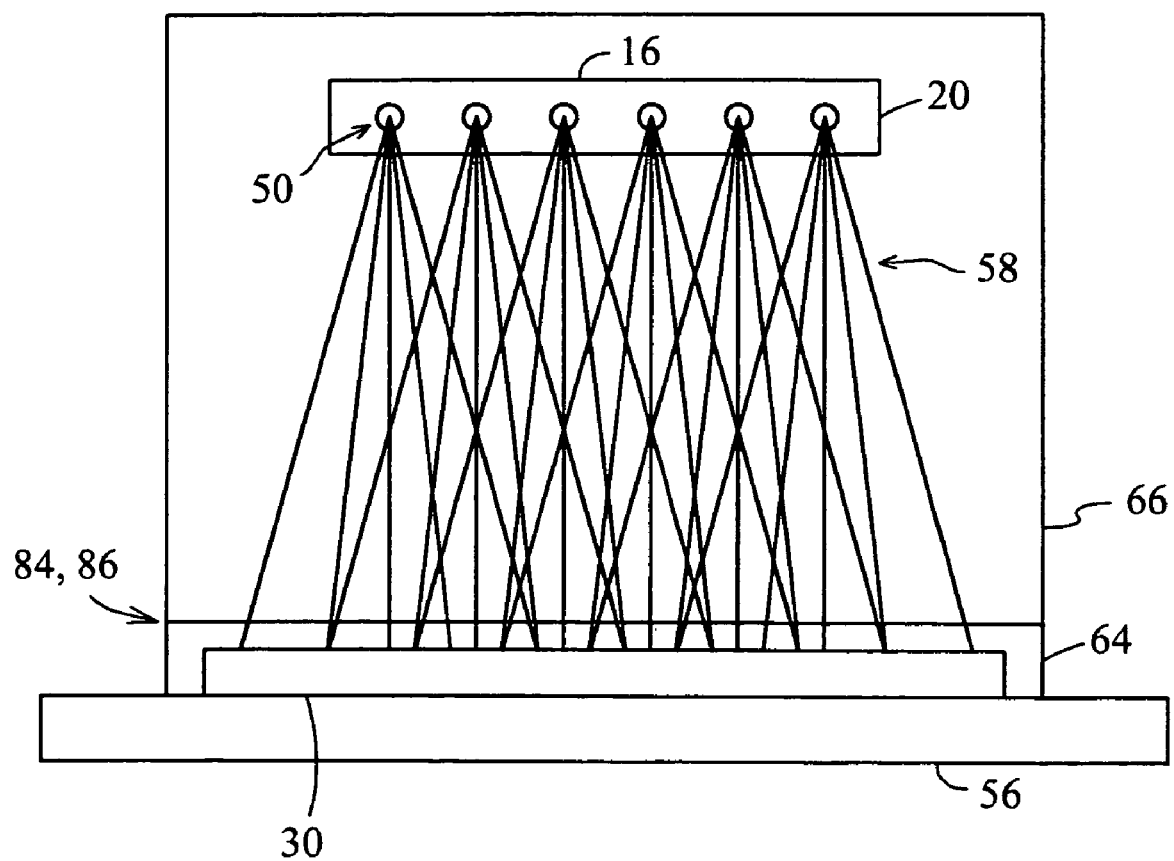
FIG. 6 depicts another view of the laser transmitter system.

In a preferred embodiment of the present invention, the feedback photonics detector 30 is used to detect a net change in optical power output from the optical array 16. FIG. 6 shows a front view of the laser communications system 10. In this view, optical signals being transmitted to the optical waveguide 24 (shown in FIG. 2) come out of the page. The detector 30 is adapted to receive reflected and scattered light 58 from all the optical ports 50 of the optical array 16. Since the operating characteristics of optical devices on the same wafer/optical array 16 tend to behave similarly, the detector 30 receives light 58 from all the optical ports 50, and the monitoring circuit 18 looks for a change in power output from the optical array 16. As the power output of the optical array 16 reduces, the light input 58 to the detector 30 accordingly reduces.

If the performance in the optical ports 50 as a whole decreases because of temperature shifts, age, or other similar causes, then the use of one photodetector 30 can provide an appropriate feedback signal that can in turn instruct the laser driver 14 to increase output power accordingly.

Alternatively, the output of the individual ports 50 may be measured individually under a multiplexing format. A multiplexing circuit 90 within the driver 14 may individually activate the ports 50 on start up and measure an output of each port 50. Alternatively, the multiplexing circuit 90 may monitor for those events where only a single port 50 or a small number of ports 50 are active. A simple summing equation may then be used to determine the specific output of each port 50 and to adjust a driver level accordingly.

The use of one photodetector 30 to provide feedback for all the optical ports 50 has cost and manufacturing advantages. If, instead, one photodiode were to be used to monitor each optical port of the optical array, the overall cost of the communications device would increase. In addition, manufacturing yield would decrease if additional optical components were added to the system, and optical diodes tend to have a greater fallout rate than passive optical components.

Another advantage of the present invention lies in the source of light providing the feedback signal. Optical signals that would normally be lost due to scattering and/or reflection are, instead used to provide optical feedback to improve and optimize performance of the optical transmitter. As previously stated, the majority of light from the laser array 16 may be transmitted to the optical waveguide 24. Some light is naturally lost because of differences in index of refraction, reflection, and absorption. It is the intent of the invention to use light that would otherwise be considered lost, thus maintaining a relatively high optical power level transmitted to the optical waveguide. This can preserve optical signal integrity as well.

A specific embodiment of a method and apparatus for monitoring an optical signal from a solid state laser has been described for the purpose of illustrating the manner in which the invention is made and used. It should be understood that the implementation of other variations and modifications of the invention and its various aspects will be apparent to one skilled in the art, and that the invention is not limited by the specific embodiments described. Therefore, it is contemplated to cover the present invention and any and all modifications, variations, or equivalents that fall within the true spirit and scope of the basic underlying principles disclosed and claimed herein.

What is claimed is:

1. A method of monitoring an optical output beam from a solid state laser transmitted through a waveguide, such method comprising the steps of:

providing a planar substrate that divides the optical output beam into a first portion and a second portion, said substrate defined by opposing planar surfaces and a substrate edge that together define a substrate volume that is transparent to the optical beam from the solid state laser;

disposing the waveguide on a first side of the opposing planar surfaces of the planar substrate;

disposing the solid state laser on a second side of the opposing planar surfaces of the planar substrate, such that the optical beam from the solid state laser enters the planar substrate through the second side of the planar substrate, the first portion of the optical beam travels directly through the planar substrate substantially orthogonal to the opposing planar surfaces and enters the waveguide by passing through the first side of the planar substrate and the second portion of the optical beam is reflected between the opposing planar surfaces of the planar substrate and passes out of the substrate through the substrate edge; and disposing an optical detector proximate the edge of the planar substrate to detect the second portion of the optical beam.

2. The method of monitoring an optical beam from a solid state laser as in claim 1 further comprising defining the substrate as an optically transparent substrate.

3. The method of monitoring an optical beam from a solid state laser as in claim 2 further comprising defining the solid state laser as a vertical cavity surface emitting laser.

4. The method of monitoring an optical beam from a solid state laser as in claim 3 further comprising providing a groove along an edge of the planar substrate said groove separating the planar substrate from a support substrate and breaking a connection between the planar substrate and substrate substrate along the groove to allow the planar substrate to be rotated relative to the support substrate into an operative position relative to the support substrate.

5. The method of monitoring an optical beam from a solid state laser as in claim 4 further comprising mechanically scribing the groove along the edge of the planar substrate.

6. The method of monitoring an optical beam from a solid state laser as in claim 4 further comprising laser ablading the groove along the edge of the planar substrate.

7. The method of monitoring an optical beam from a solid state laser as in claim 6 further comprising roughening the substrate edge such that light striking the roughened edge may pass out of the substrate.

8. An apparatus for monitoring an optical output beam from a solid state laser transmitted through a waveguide, such apparatus comprising:

a planar substrate that divides the optical output beam into a first portion and a second portion, the substrate defined by opposing planar surfaces and a substrate edge that together define a substrate volume that is transparent to the optical beam from the solid state laser;

the solid state laser disposed on a first side of the opposing planar surfaces of the planar substrate and the wave guide disposed on a second, opposing side of the substrate, such that the optical output beam from the solid state laser enters the planar substrate through the first side, the first portion of the optical beam travels directly through the planar substrate substantially orthogonal to the opposing planar surfaces and enters the wave guide by passing through the second side of the planar substrate and a second portion of the optical beam entering the substrate through the first side is reflected between the opposing planar surfaces of the planar substrate and passes out of the substrate through the substrate edge; and an optical detector disposed proximate the edge of the planar substrate to detect the second portion of the optical beam.

9. The apparatus for monitoring an optical beam from a solid state laser as in claim 8 wherein the substrate further comprises an optically transparent substrate.

10. The apparatus for monitoring an optical beam from a solid state laser as in claim 9 wherein the solid state laser further comprises a vertical cavity surface emitting laser.

11. The apparatus for monitoring an optical beam from a solid state laser as in claim 10 further comprising providing a groove along an edge of the planar substrate, said groove separating the planar substrate from a support substrate and breaking a connection between the planar substrate and support substrate along the groove.

12. The apparatus for monitoring an optical beam from a solid state laser as in claim 11 wherein the groove further comprises a mechanically scribed groove disposed in the substrate.

13. The apparatus for monitoring an optical beam from a solid state laser as in claim 12 wherein the groove further comprises a laser abladed groove disposed in the substrate.

14. The apparatus for monitoring an optical beam from a solid state laser as in claim 13 further comprising the substrate edge being roughened such that light striking the roughened edge may pass out of the substrate.

* * * * *